United States Patent [19]
Fujiwara et al.

[11] Patent Number: 5,435,886
[45] Date of Patent: Jul. 25, 1995

[54] METHOD OF PLASMA ETCHING

[75] Inventors: Nobuo Fujiwara; Takahiro Maruyama; Kenji Kawai; Takahiro Hoshiko, all of Itami, Japan

[73] Assignee: Mitsubishi Denki Kabushiki Kaisha, Tokyo, Japan

[21] Appl. No.: 247,405

[22] Filed: May 23, 1994

Related U.S. Application Data

[62] Division of Ser. No. 998,738, Dec. 30, 1992.

[30] Foreign Application Priority Data

Aug. 11, 1992 [JP] Japan .................. 4-214257

[51] Int. Cl.⁶ ............................ B44C 1/22
[52] U.S. Cl. ................ 156/643.1; 156/345; 204/298.38
[58] Field of Search ............ 204/298.37, 298.38; 118/723 MW, 723 ME, 723 MR, 723 MA; 156/345, 643; 134/1; 315/111.21, 111.31

[56] References Cited

U.S. PATENT DOCUMENTS

| | | | |
|---|---|---|---|
| 4,298,419 | 11/1981 | Suzuki et al. | 156/345 |
| 4,401,054 | 8/1983 | Matsuo | 118/723 |
| 4,877,509 | 10/1989 | Ogawa et al. | 204/298 |
| 4,891,118 | 1/1990 | Ooiwa | 204/298 |
| 4,982,138 | 1/1991 | Fujiwara et al. | 315/111.41 |
| 5,160,397 | 11/1992 | Doki | 156/345 |
| 5,192,717 | 3/1993 | Kawakami | 439/233 |

FOREIGN PATENT DOCUMENTS 0395415  4/1990  European Pat. Off. .

OTHER PUBLICATIONS

Caughman et al, "The Effects of Substrate Bias on Plasma Parameters in an Electron Cyclotron Resonance Plasma Reactor", J. Vac. Sci. Technology A9 (6), Nov./Dec. 1991, pp. 3113–3118.

"Ferromagnetic Electrode for Magnetically-Enhanced Plasma Processing System", IBM Technical Disclosure Bulletin, vol. 31, No. 3 Aug. 1988, pp. 263–264.

Dünne Schichten Heft 4 (1992) S. 13–15.

Morimoto et al, "The Influence Of Incident Angle Distributions Of Plasma Particles On The Etched Profiles Of Silicon Films", 1991 Dry Process Symposium, pp. 57–62.

Primary Examiner—R. Bruce Breneman
Assistant Examiner—Joni Y. Chang
Attorney, Agent, or Firm—Leydig, Voit & Mayer

[57] ABSTRACT

A method of electron cyclotron resonance plasma etching including generating a constant plasma in a gas in a chamber containing a semiconductor wafer by supplying microwave energy to the chamber continuously and applying a pulsed direct current bias to the semiconductor wafer, wherein the pulsed bias has a period substantially equal to a time constant determined by the capacitance of the semiconductor wafer and the resistance of an ion sheath at the surface of the semiconductor wafer.

4 Claims, 17 Drawing Sheets

METHOD OF PLASMA ETCHING

This application is a divisional of application Ser. No. 07/998,738, filed Dec. 30, 1992.

BACKGROUND OF THE INVENTION

1. Field of the Invention

The present invention relates to a plasma etching apparatus, and particularly to a dry etching apparatus (ECR etching apparatus) which employs electron cyclotron resonance.

2. Description of the Related Art

FIG. 18 is a schematic drawing of a conventional plasma etching apparatus. In the drawing, a stage 3 for mounting and holding a sample, e.g., a semiconductor wafer 2, thereon is disposed in a reaction chamber 1. A gas inlet tube 4 for introducing reactive gas into the reaction chamber 1 is provided on the upper side of the reaction chamber 1. Microwave generating means, e.g., a microwave power source 5, for generating microwaves is provided outside the reaction chamber 1. Microwave energy with a predetermined frequency generated by the microwave power source 5 is introduced into the reaction chamber 1 through a waveguide and a quartz window 7. In addition, a coil 8 serving as magnetic field generating means is provided on the outer periphery of the quartz window 7 of the reaction chamber 1. The coil 8 causes the vertical application of a magnetic field with a predetermined magnetic flux density to a surface of the semiconductor wafer 2 mounted on the stage 3. The magnetic field generating means may comprise either a coil or a permanent magnet. An exhaust port 9 is also provided on the lower side of the reaction chamber 1, and exhaust means (not shown) such as a vacuum pump or the like which is connected to the exhaust port 9 functions to evacuate the reaction chamber 1 and keep it at a predetermined degree of vacuum.

In the conventional plasma etching apparatus configured as described above, when the semiconductor wafer 2 is etched, the reaction chamber 1 is first evacuated, and the reaction gas such as a halogen gas or the like is then introduced from the gas inlet tube 4 while the reaction chamber 1 is evacuated to keep the interior of the reaction chamber 1 at a predetermined pressure. Microwave energy is then generated by the microwave power source 5 and is introduced into the reaction chamber 1 through the waveguide 6 and the quartz window 7, and a magnetic field is applied to the reaction chamber 1 by the coil 8. The resonance between the magnetic field and the microwave energy causes electrons performing a cyclotron motion to absorb energy so that a high-density plasma is generated by collision of the electrons with the reactive gas. The generated plasma is carried to the semiconductor wafer 2 along the lines of magnetic force generated by the coil 8 to etch the semiconductor wafer 2.

A so-called ion sheath electric field is generated on the surface of the semiconductor wafer 2 irradiated with the plasma in the direction perpendicular to the semiconductor wafer 2 by the potential difference between the plasma potential and a floating potential. Cations (referred to as "ions" hereinafter) present in the plasma are accelerated by the ion sheath electric field and are thus applied to the surface of the semiconductor wafer 2 with good rectilinearity, thereby forming a fine pattern on the surface of the semiconductor wafer 2.

Since the ions in the plasma are accelerated by the ion sheath electric field, as described above, the ions are applied to the semiconductor wafer 2 with a uniform directional property. However, the electrons in the plasma are decelerated by the ion sheath electric field and are thus applied to the semiconductor wafer 2 without a directional property.

This state is further described in detail below with reference to FIGS. 19 and 20. FIGS. 19 and 20 are enlarged sectional views of the surface of the semiconductor wafer 2 and show the behavior of the ions and the electrons during fine pattern etching of the semiconductor wafer 2 using a plasma etching apparatus. In FIG. 19, an $SiO_2$ film 10, an Si film 11 and a resist pattern 12 are formed in turn on the surface of the semiconductor wafer 2 so that etching is performed using as a mask the resist pattern 12. Since both the ions and electrons are applied to the surface of the resist pattern 12 as etching proceeds, electrical neutrality is maintained. Since the ions enter a micro-pattern 13 in a direction perpendicular to the surface of the semiconductor wafer 2, the ions reach the bottom 15 of the micro-pattern 13 without colliding with the side wall 14 of the micro-pattern 13. On the other hand, since the electrons have no directional property, as described above, the electrons are applied to the side wall 14 of the micro-pattern 13 and thus do not easily reach the bottom 15 of the micro-pattern 13.

In this case, when a conductive film such as the Si film 11 is etched, as shown in FIG. 19, the ions applied to the micro-pattern bottom 15 and the electrons applied to the micro-pattern side wall 14 recombine in the film to neutralize it, thereby maintaining electrical neutrality. However, when an insulating film such as the $SiO_2$ film 10 is exposed as etching proceeds, as shown in FIG. 20, the ions applied to the micro-pattern bottom 15 are not neutralized by the electrons applied to the micro-pattern side wall 14, and thus the micro-pattern bottom 15 is positively charged. On the other hand, the micro-pattern side wall 14 is negatively charged up by the electrons applied thereto. The orbit of the ions applied to the micro-pattern bottom 15 is thus bent by repulsion of the positive charge in the micro-structure bottom 15 that is positively charged and by attraction of the micro-pattern side wall 14 that is negatively charged. As a result, the ions locally enter the interface between the Si film 11 and the $SiO_2$ film 10 to form a so-called notch.

In order to prevent the occurrence of such a notch, the plasma etching apparatus shown in FIG. 21 is generally used. In the plasma etching apparatus shown in FIG. 21, a RF (high frequency) power source 17 is connected to a stage 3 through an impedance matching unit 16. The RF power source 17 causes the application of a RF bias voltage to a semiconductor wafer 2 so that ions can be increased in energy by acceleration and applied to the semiconductor wafer 2. In the apparatus, since the orbit of the ions is slightly bent by the charging because of the high ion energy, a notch does not easily occur. However, the high ion energy causes etching of the $SiO_2$ film 10 as a base film, thereby causing the problem of decreasing the etching selectivity.

As shown in FIG. 18, the lines B of magnetic force produced by a coil 8 diverge from the coil 8 at the center and they are not perpendicular to the semiconductor wafer 2 at the circumference of the surface of the semiconductor wafer 2. Although ions are applied to the semiconductor wafer 2 with good rectilinearity because the ions are accelerated by the ion sheath electric field, since the ions are produced by the collision of electrons with the reactive gas, the ions have a tendency to move along the lines B of magnetic force so as to follow the electrons. There is thus the problem that the ions are not vertically applied to the semiconductor wafer 2 at the circumference of the semiconductor wafer 2, and thus anisotropic etching cannot be sufficiently performed.

In addition, the lines of magnetic force B are sparse at the circumference of the semiconductor wafer 2, as compared with the central portion thereof. There is also the problem that since a difference in the plasma density at the central portion and the circumference of the semiconductor wafer 2 causes a difference in the etching speeds of the two portions, the uniformity of etching deteriorates.

The aforementioned plasma etching apparatus thus has the problem of producing a notch due to the local charging in the above-described micropattern, thereby deteriorating the anisotropy of etching.

There is also the problem that if the anisotropy of etching is increased by increasing the ion energy, the etching selectivity is decreased, and it is thus difficult to perform etching with the anisotropy and the etching selectivity, both of which are improved.

The apparatus further has the problem that since the lines of magnetic force diverge from the coil at the center, anisotropic etching cannot be sufficiently effected at the circumference of the semiconductor wafer 2, thereby deteriorating the uniformity of etching.

SUMMARY OF THE INVENTION

The present invention has been achieved for solving the above problems, and an object of the present invention to provide a plasma etching apparatus which prevents the occurrence of a notch by preventing local charging in a micro-pattern, and which is capable of improved anisotropic and selective etching even at the circumference of a semiconductor wafer.

In accordance with a first aspect of the present invention, there is provided a plasma etching apparatus comprising a stage for mounting a sample thereon, a reaction chamber containing the stage, microwave generating means for generating microwave energy, a waveguide for guiding the microwave energy generated by the microwave generating means to the reaction chamber, magnetic field generating means for applying a magnetic field to the reaction chamber, a gas inlet tube for introducing reactive gas into the reaction chamber, exhaust means for evacuating the reaction chamber, and a pulsed power source for applying a pulse bias voltage to the sample, wherein a plasma of the reactive gas is formed by electron cyclotron resonance so that the sample is etched by the plasma.

In accordance with another aspect of the present invention, there is provided a plasma etching apparatus comprising a stage for mounting a sample thereon, a reaction chamber containing the stage, microwave generating means for generating microwave energy, a waveguide for guiding the microwave energy generated by the microwave generating means to the reaction chamber, magnetic field generating means for applying a magnetic field to the reaction chamber, a gas inlet tube for introducing reactive gas into the reaction chamber, exhaust means for evacuating the reaction chamber, and a ferromagnetic member around the stage, wherein a plasma of the reactive gas is formed by electron cyclotron resonance so that the sample is etched by the plasma.

In accordance with a further aspect of the present invention, there is provided a plasma etching apparatus comprising a stage for mounting a sample thereon, a reaction chamber containing the stage, microwave generating means for generating microwave energy, a waveguide for guiding the microwave energy generated by the microwave generating means to the reaction chamber, magnetic field generating means for applying a magnetic field to the reaction chamber, a gas inlet tube for introducing reactive gas into the reaction chamber, exhaust means for evacuating the reaction room, a superconductor member which forms at least a surface of the stage on which the sample is mounted, and cooling means for cooling the superconductor member to a predetermined temperature so as to bring the member into a superconducting state, wherein a plasma of the reactive gas is formed by electron cyclotron resonance so that the sample is etched by the plasma.

In accordance with a still another aspect of the present invention, there is provided a plasma etching apparatus comprising a stage for mounting a sample thereon, a reaction chamber containing the stage, microwave generating means for generating microwave energy, a waveguide for guiding the microwave energy generated by the microwave generating means to the reaction chamber, magnetic field generating means for applying a magnetic field to the reaction chamber, a gas inlet tube for introducing reactive gas into the reaction chamber, exhaust means for evacuating the reaction chamber, and a diamagnetic member on a side wall of the reaction chamber surrounding the stage, wherein a plasma of the reaction gas is formed by electron cyclotron resonance so that the sample is etched by the plasma.

In accordance with a still further aspect of the present invention, there is provided a plasma etching apparatus comprising a stage for mounting a sample thereon, a reaction chamber containing the stage, microwave generating means for generating microwave energy, a waveguide for guiding the microwave energy generated by the microwave generating means to the reaction chamber, magnetic field generating means for applying a magnetic field to the reaction chamber, a gas inlet tube for introducing reactive gas into the reaction chamber, exhaust means for evacuating the reaction chamber, and a diamagnetic focus ring on a side of the stage, wherein a plasma of the reaction gas is formed by electron cyclotron resonance so that the sample is etched by the plasma.

DESCRIPTION OF THE PREFERRED EMBODIMENTS

Embodiment 1

Figure 1:
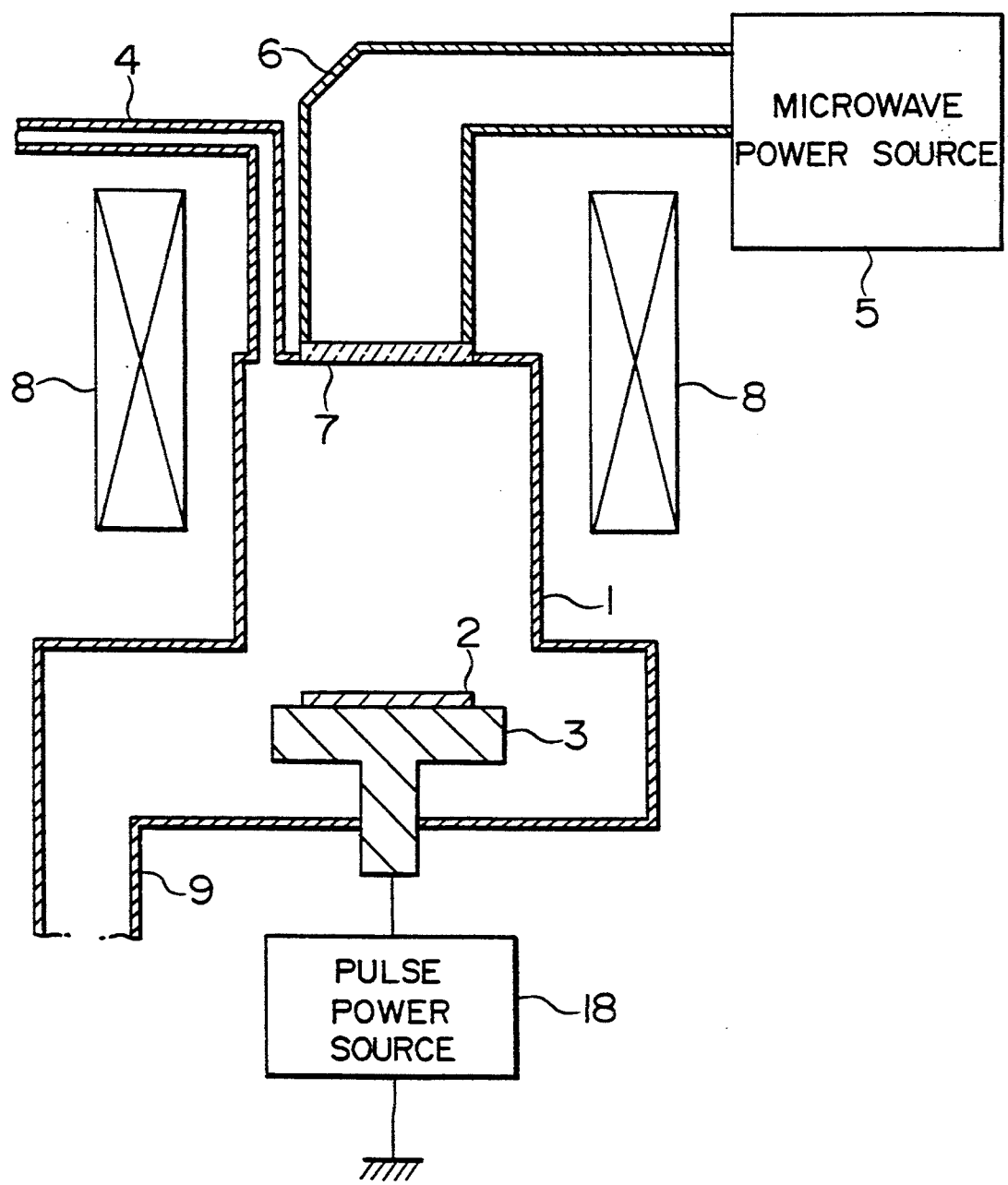
FIG. 1 is a schematic drawing showing a plasma etching apparatus in accordance with Embodiment 1 of the present invention.

FIG. 1 is a schematic drawing showing a plasma etching apparatus in accordance with Embodiment 1 of the present invention. In the drawings, the same reference numerals denote the same or equivalent portions. In FIG. 1, a pulse power source 18 is connected to a stage 3 for supporting a semiconductor wafer 2.

In the plasma etching apparatus configured as described above, when the semiconductor wafer 2 is etched, a reaction chamber 1 is first evacuated, and reactive gas is then introduced into the reaction chamber 1 through a gas inlet tube 4 while the reaction chamber 1 is evacuated to keep the inside of the reaction chamber 1 at a predetermined pressure. Microwave energy is generated by a microwave power source 5 and is guided into the reaction chamber 1 through a waveguide 6 and a quartz window 7, and a magnetic field is applied to the reaction chamber 1 by a coil 8 to generate a gas plasma. At the same time, a pulsed voltage is generated by the pulse power source 18 connected to the stage 3 to apply a positive pulsed bias voltage to the semiconductor wafer 2 through the stage 3. The gas plasma generated in the reaction chamber 1 is carried along the lines of magnetic force produced by the coil 8 to etch the semiconductor wafer 2.

Figure 2:
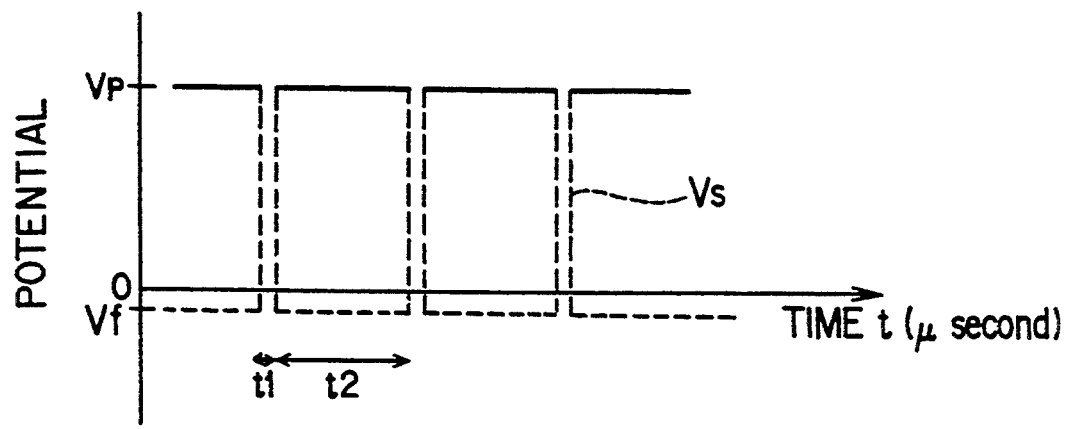
FIG. 2 is a graph explaining the potential of the ion sheath electric field at the surface of a semiconductor wafer.

FIG. 2 is a graph explaining the ion sheath electric field at a surface of the semiconductor wafer 2 placed in the gas plasma. Namely, during the time ($t_2$) no pulsed bias voltage is applied and the potential (substrate potential Vs) of the semiconductor wafer 2 is equal to a floating potential (Vf) determined by the state of the plasma. The potential difference between the floating potential and the plasma potential (Vp) forms the ion sheath electric field. In Embodiment 1, the ion sheath electric field is 20 V.

Since a pulsed voltage of at least 20 V is applied to the semiconductor wafer 2 by the pulse power source 18 through the stage 3, during the time $t_1$ that the voltage pulse is applied, the potential difference between the plasma potential and the substrate potential disappears due to an increase in the substrate potential, and the ion sheath electric field thus disappears. As a result and since the electrons in the plasma can freely enter the semiconductor wafer 2 during the time $t_1$, the electrons reach the bottom 15 of the micropattern, thereby neutralizing the positive charge at the bottom 15 of the micropattern.

Figure 3:
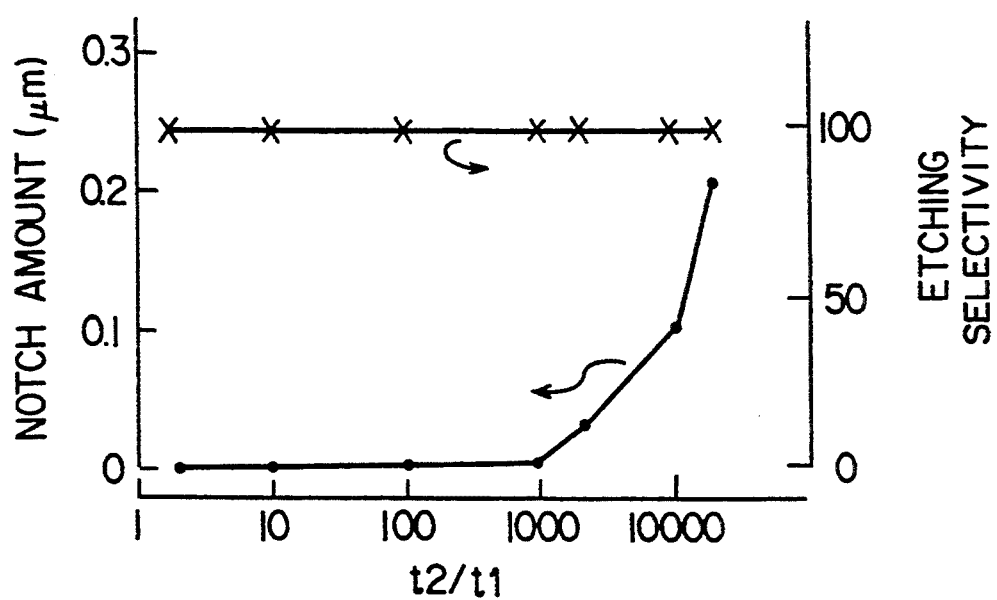
FIG. 3 is a graph showing the dependency of notch size on the pulse voltage on/off time ratio.
Figure 19:
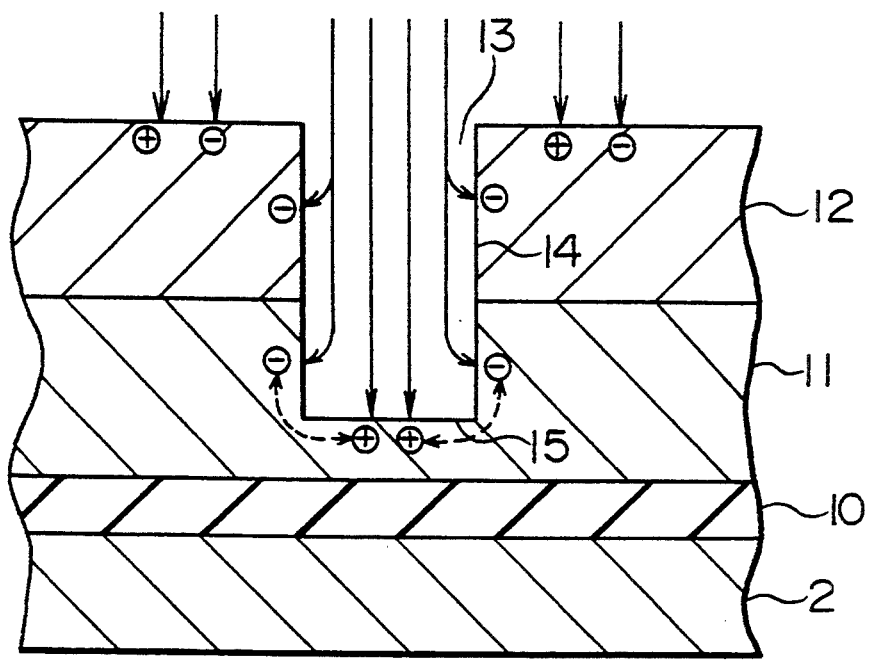
FIG. 19 is an enlarged sectional view showing a micropattern on the surface of a semiconductor wafer.
Figure 20:
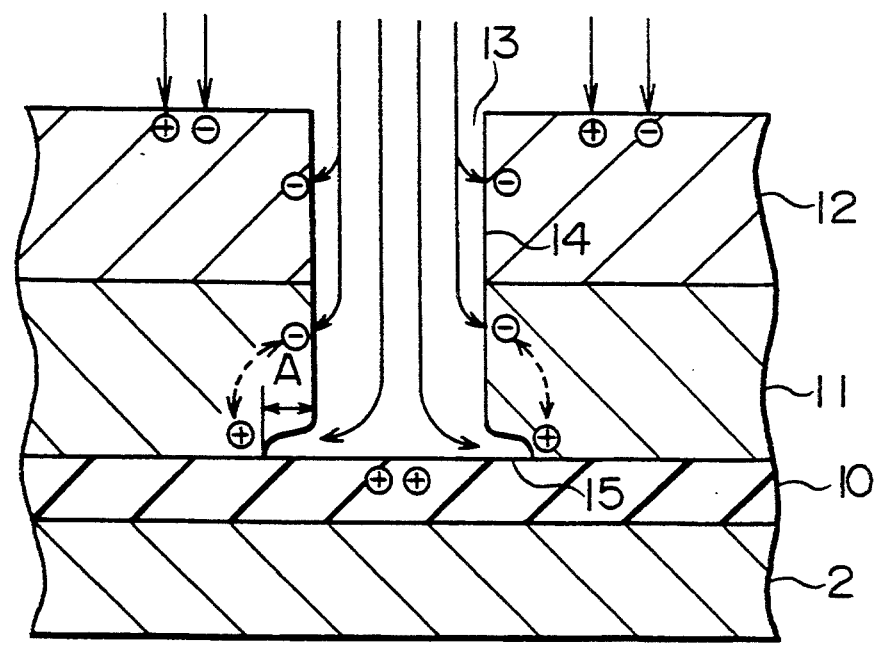
FIG. 20 is an enlarged sectional view showing a micropattern on the surface of a semiconductor wafer.

FIG. 3 is a graph showing the dependency of the notch size (denoted by A in FIG. 20) at the interface between the $SiO_2$ film 10 and the Si film 11, which are shown in FIG. 19 and 20, on the pulsed voltage on/off time ratio ($t_2/t_1$) when the Si film 11 on the $SiO_2$ film 10 is etched using the plasma etching apparatus according to Embodiment 1. The period ($t_1+t_2$) of application of the pulsed voltage is 0.1 millisecond. Although the cycle period is a time constant determined by the capacitance of the semiconductor wafer and the resistance of the sheath electric field, and is matched with the leakage time of charging, the period can be appropriately changed in accordance with the type of the semiconductor wafer used, the etching conditions, the leakage time of charging and so on.

As seen from FIG. 3, the notch size decreases as the pulsed voltage application time $t_1$ increases and the ratio $t_2/t_1$ decreases. Particularly, the notch is not observed at all when $t_2/t_1 < 1000$. This is because since an electron has a smaller mass and higher mobility than an ion, charge can be completely neutralized if the time $t_2$ is not more than several hundreds of times the time $t_1$, which is the electron inflow time.

FIG. 3 also shows the etching selectivity between the Si film 11 and the $SiO_2$ base film 10. In the conventional plasma etching apparatus shown in FIG. 21 in which the notch is decreased by applying an RF bias voltage, if an attempt is made to remove the notch, the etching selectivity becomes 20 or less due to an increase in the ion energy. However, in the apparatus according to Embodiment 1 of the present invention, since the positive pulsed bias is applied, the ion energy is not increased, and the etching selectivity is constant at 100 which is the same as that for the application of no bias.

Embodiment 2

Figure 4:
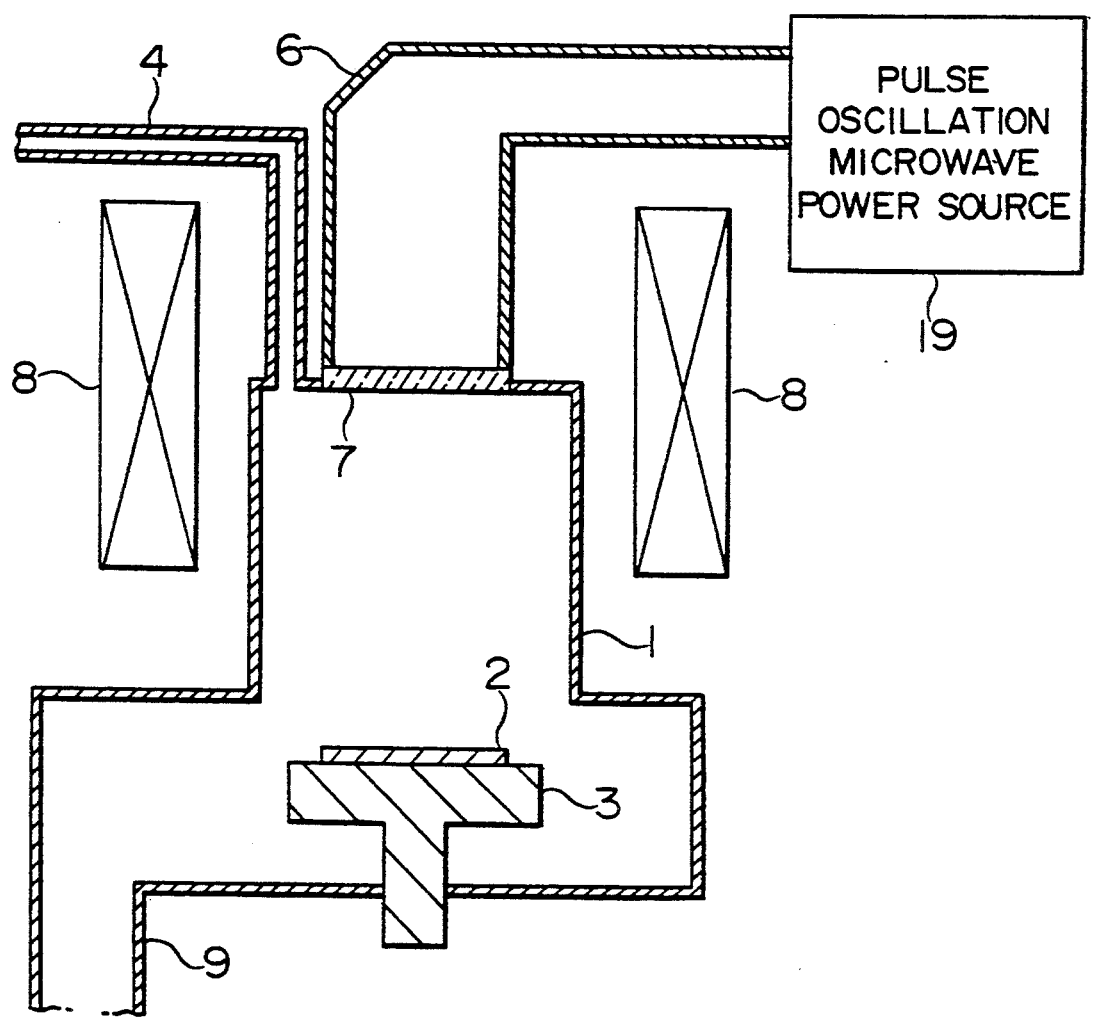
FIG. 4 is a schematic drawing showing a plasma etching apparatus in accordance with Embodiment 2 of the present invention.
Figure 5:
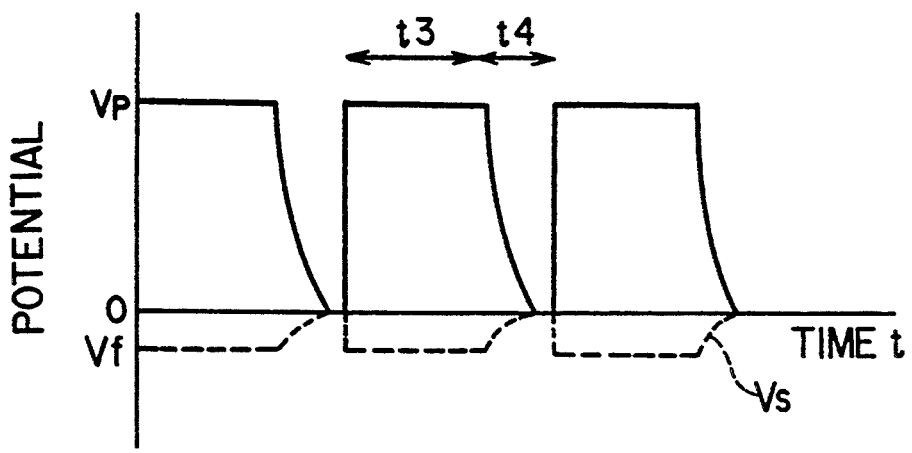
FIG. 5 is a graph explaining the potential of the ion sheath electric field at the surface of a semiconductor wafer.

FIG. 4 is a schematic drawing showing a plasma etching apparatus in accordance with Embodiment 2 of the present invention. The apparatus shown in FIG. 4 includes a pulse oscillation microwave power source 19 in place of the microwave power source 5 of the conventional plasma etching apparatus. The pulse oscillation microwave power source 19 is intermittently turned on and off to supply microwave energy with a cycle frequency of, for example, 10 kHz, for plasma etching treatment. The ion sheath electric field at the surface of the semiconductor wafer 2 placed in the gas plasma is as shown in FIG. 5. Namely, the potential (substrate potential Vs) of the semiconductor wafer 2 is equal to a floating potential (Vf) determined by the state of the plasma, and the ion sheath electric field is formed by a potential difference between the floating potential (Vf) and the plasma potential (Vp). In Embodiment 2, the ion sheath electric field is 20 V.

Since the pulse oscillation microwave power source 19 intermittently produces microwave energy, the ion sheath electric field is formed by the potential difference between the plasma potential and the substrate potential during the on time $t_3$ of the microwave energy. However, during the off time $t_4$, the potential difference between the plasma potential and the substrate potential is transiently decreased due to disappearance of the plasma, and the ion sheath electric field is thus weakened. Since the electrons in the plasma can freely enter the substrate during the transient response for the off time $t_4$, the electrons can reach the bottom 15 of the micropattern to neutralize the positive charge at the bottom 15 of the micropattern.

Figure 6:
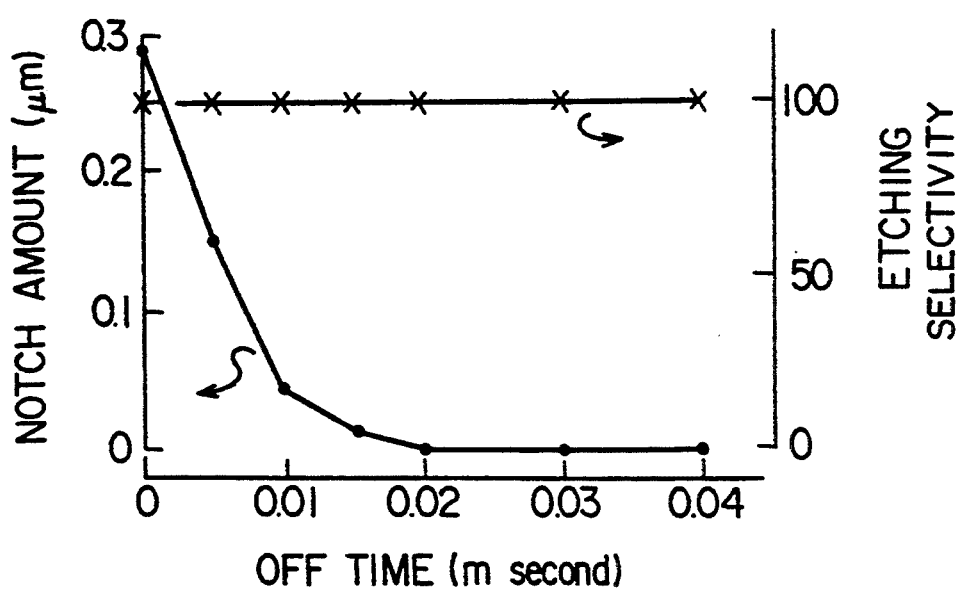
FIG. 6 is a graph showing the dependency of notch size on the microwave energy off time.

FIG. 6 is a graph showing the dependency of the notch size (denoted by A in FIG. 20) at the interface between the SiO$_2$ film 10 and the Si film 11 which are shown in FIGS. 19 and 20, on the microwave off time when the Si film 11 on the SiO$_2$ film 10 is etched using the plasma etching apparatus according to Embodiment 2. As seen from FIG. 6, the notch size is decreased by increasing the microwave off time $t_4$, and no notch is observed when the off time is 0.02 millisecond or more. In this embodiment, the cycle period ($t_3 + t_4$) which is the sum of the microwave on time and the microwave off time is 0.1 millisecond, as in Embodiment 1.

Figure 21:
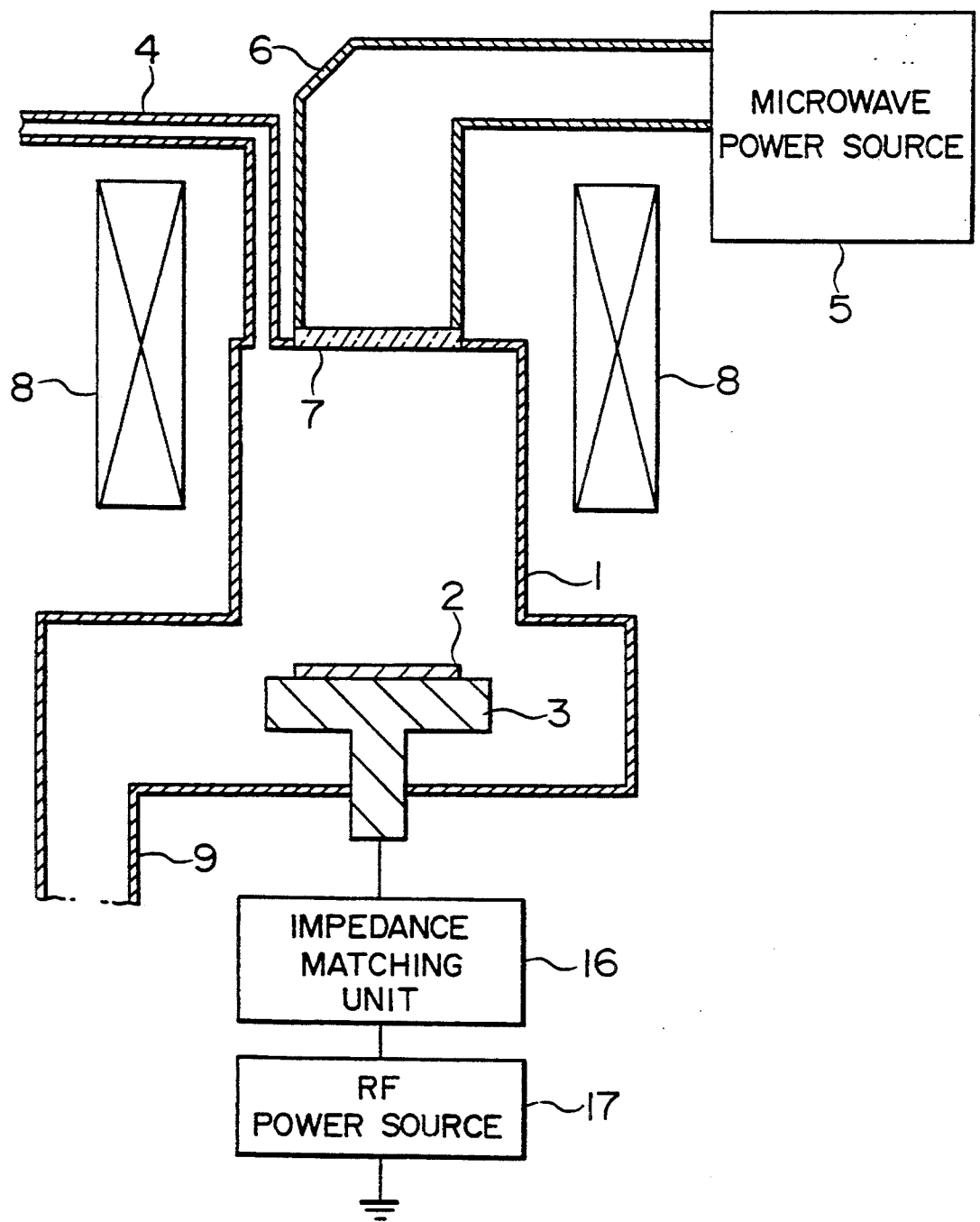
FIG. 21 is a schematic drawing showing another conventional plasma etching apparatus.

In the conventional plasma etching apparatus shown in FIG. 21 in which the notch is decreased by applying an RF bias, the etching selectivity is 20 or less when an attempt is made to remove the notch. However, in Embodiment 2, since the charging is restricted by intermittently weakening the ion sheath electric field employing the attenuation of the plasma during the microwave off time, as shown in FIG. 6, the ion energy is not increased, and the etching selectivity is constant at 100 which is the same as that obtained when the microwave energy is continuously supplied, not intermittently supplied.

Embodiment 3

Figure 7:
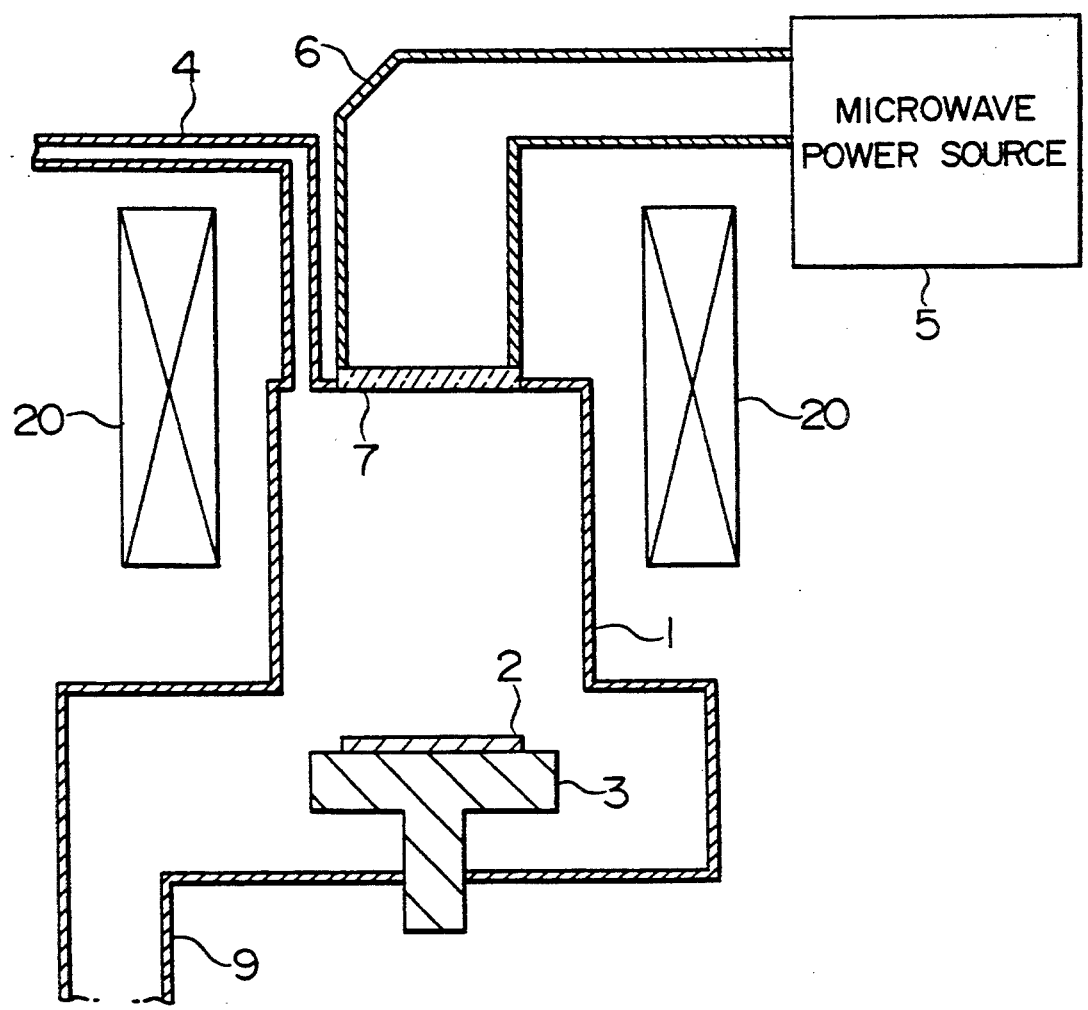
FIG. 7 is a schematic drawing showing a plasma etching apparatus in accordance with Embodiment 3 of the present invention.
Figure 8:
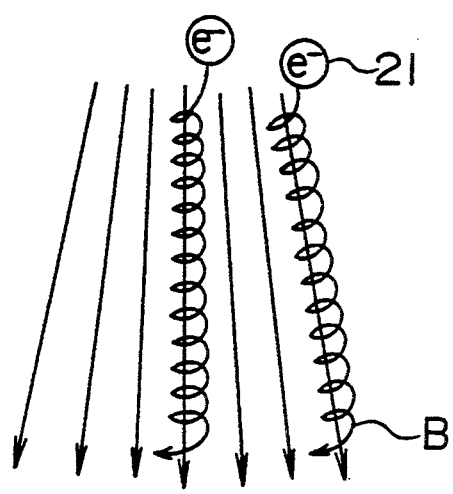
FIG. 8 is a schematic drawing showing the motion of electrons in a magnetic field.

FIG. 7 is a schematic drawing showing a plasma etching apparatus in accordance with Embodiment 3 of the present invention. The apparatus shown in the drawing includes a strong magnetic field coil 20 for generating a magnetic field of at least 2000 gauss (0.2 T) in place of the coil 8 of the conventional plasma etching apparatus. FIG. 8 is a drawing schematically showing the motions of electrons in a magnetic field. As shown in FIG. 8, an electron 21 is subjected to the Lorentz force and moves so as to coil around the line of magnetic force B. At this time, the radius of gyration of the locus of the electron 21 is known as the "Larmor radius" and expressed by the following equation (1):

$$R = m_e V_v / qB \quad (1)$$

wherein R is the Larmor radius; q, the charge amount of an electron; $m_e$, the mass of an electron; B, the magnetic flux density; and $V_v$, the velocity component of an electron in the direction vertical to a line of magnetic force.

When $V_v$ is the same, the Larmor radius thus decreases as the magnetic flux density increases.

The relation between the electron temperature and the average thermal motion velocity is expressed by the following equation (2):

$$V = (8kT_e / \pi m_e)^{\frac{1}{2}} \quad (2)$$

wherein V is the average thermal motion velocity; k, Boltzmann's constant; and $T_e$, the electron temperature. For example, when the electron temperature is 5 eV, the average thermal motion velocity is about $1.5 \times 10^{-6}$ m/s. If $V = V_v$ at a resonance position, the Larmor radius is thus 85 μm at a magnetic flux density of 1000 gauss (0.1 T) and is 0.85 μm at a magnetic flux density of 100,000 gauss (10 T).

Figure 9:
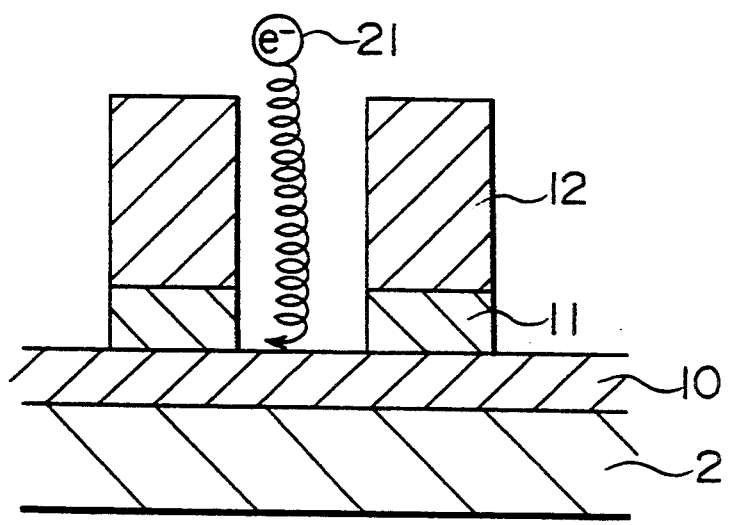
FIG. 9 is a schematic drawing showing a state wherein an electron with a small Larmor radius enters a micro-pattern.

If the Larmor radius is smaller than the interval of the pattern, as shown in FIG. 9, the probability of collision of the electron 21 with the side wall of a mask material is decreased, and the difference in charging caused by a difference in the density of the pattern is decreased. In fact, since the momentum of an electron in a divergent magnetic field is converted into a component in the direction of the line of magnetic force, and $V_v$ is decreased, the Larmor radius is decreased even when the Larmor radius is greater than the interval of the pattern.

Figure 10:
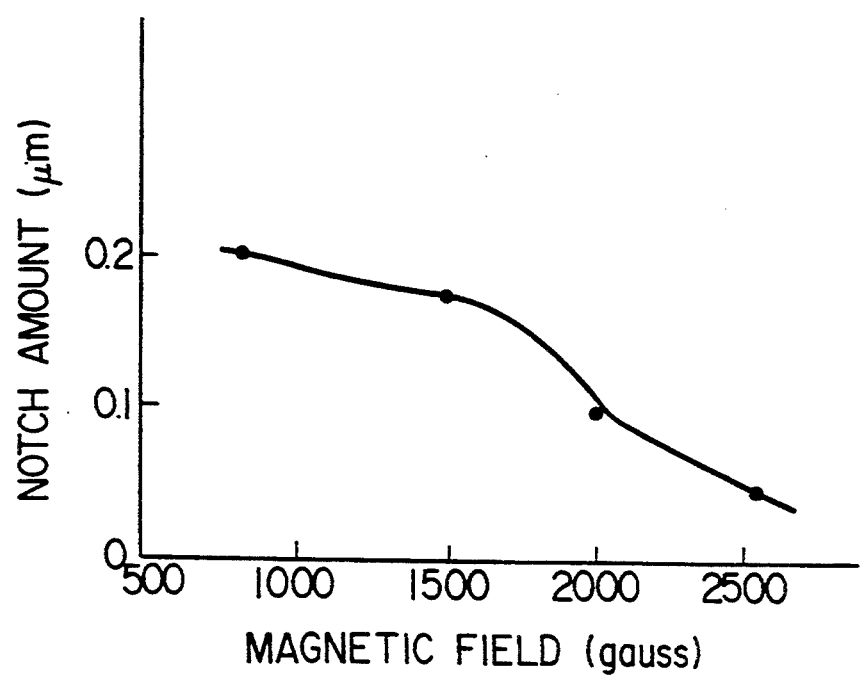
FIG. 10 is a graph showing the dependency of notch size on the magnetic field intensity in a micropattern.

FIG. 10 is a graph showing the dependency of notch size on the magnetic field intensity at a resonance point. As seen from the drawing, the notch amount is significantly decreased at a magnetic field intensity of about 2000 gauss or more.

For example, when a klystron or gyrotron is used as a microwave supply source, microwave energy at several GHz to several thousands of GHz which resonates at a magnetic field of 2000 gauss or more can be generated. In addition, a magnetic field up to several tens of T can be generated using as the strong magnetic field coil 20 a normal conducting magnet or a superconducting magnet.

Further, the intensity of the magnetic field above the semiconductor wafer 2 may be intermittently increased to 10 T or more by the strong magnetic field coil 20. Namely, for example, for microwave energy at 2.45 GHz, a magnetic field of 875 gauss (0.0875 T) which is the electron cyclotron resonance magnetic field, is generated in the reaction chamber 1. When a strong magnetic field producing a magnetic flux density of 10 T (100,000 gauss) or more above the semiconductor wafer 2 is intermittently applied to the magnetic field in the steady state, the Larmor radius of the electron orbit is decreased, and the electrons thus reach the bottom 15 of the micropattern. This relieves the positive charging of the bottom 15 of the micropattern and thus permits highly anistropic etching.

Embodiment 4

Figure 11:
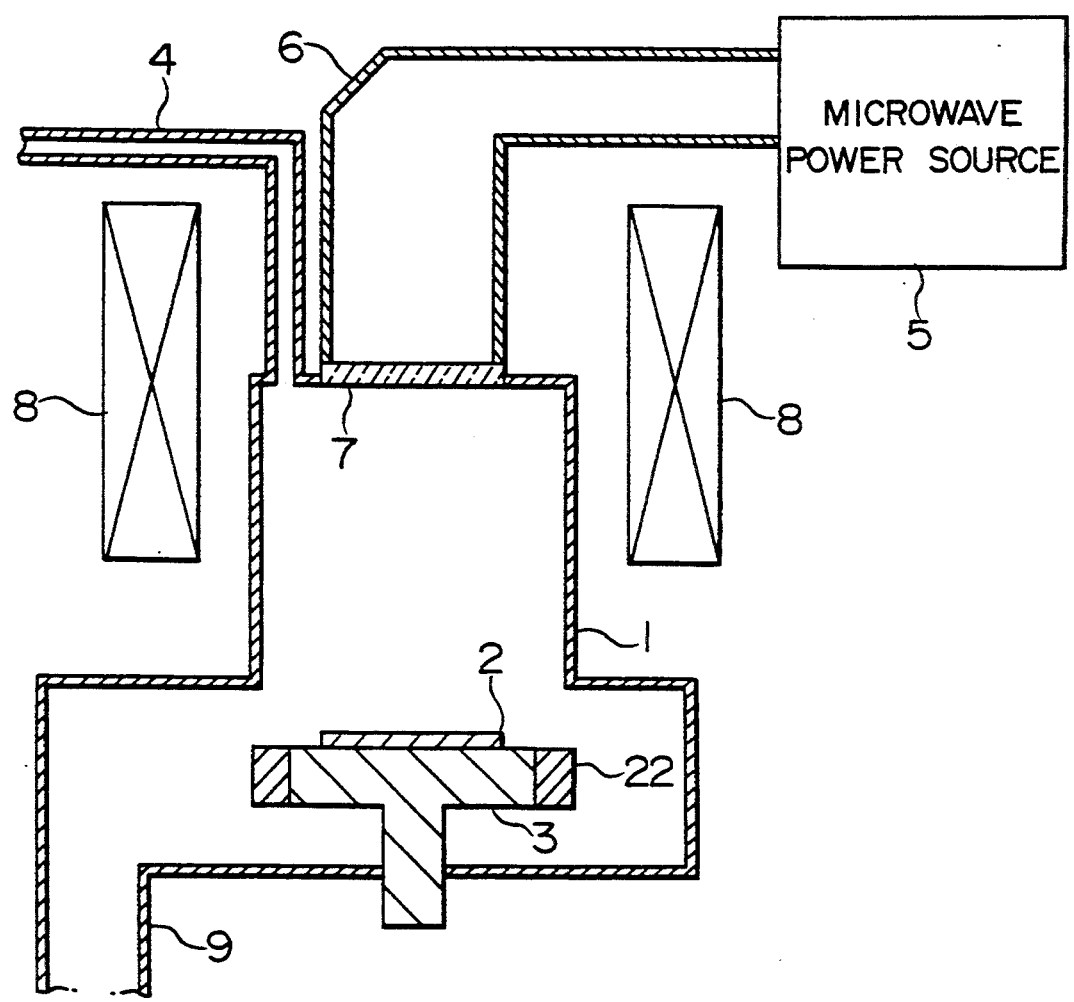
FIG. 11 is a schematic drawing showing a plasma etching apparatus in accordance with Embodiment 4 of the present invention.
Figure 12:
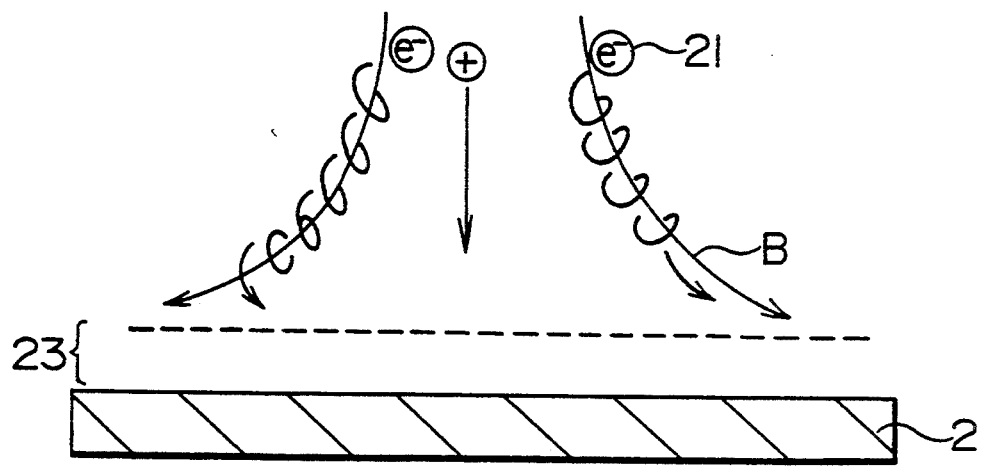
FIG. 12 is a schematic drawing showing a state wherein lines of magnetic force are bent by a ferromagnetic member above an ion sheath area.

FIG. 11 is a schematic drawing showing a plasma etching apparatus in accordance with Embodiment 4 of the present invention. The apparatus shown in the drawing has a ring-shaped ferromagnetic member 22 around the stage 3. The ferromagnetic member 22 is, for example, made of a ferromagnetic material such as SmCo, Fe, Ni or the like so that a magnetic field sharply diverging toward the ferromagnetic member 22 can be formed. As shown in FIG. 12, the lines of magnetic force B generated by the coil 8 are thus bent, by the ferromagnetic member 22, outward from the center of the semiconductor wafer 2 above the ion sheath area 23 at the surface of the semiconductor wafer 2. Since electrons each have a small mass and high mobility and move along the lines of magnetic force B, the number of the electrons carried to the surface of the semiconductor wafer 2 is smaller than in a conventional apparatus.

As a result, the negative charging in the side wall 14 of the micropattern is significantly decreased, as compared with the conventional apparatus, thereby preventing occurrence of a notch and forming a pattern having excellent anisotropy. On the other hand, since the positively charged reactive ions each have a larger mass and lower mobility than an electron, the ions cannot respond to the sharp bending of the lines of magnetic force B, and are thus accelerated by the sheath electric field and applied perpendicular to the semiconductor wafer 2.

Embodiment 5

Figure 13:
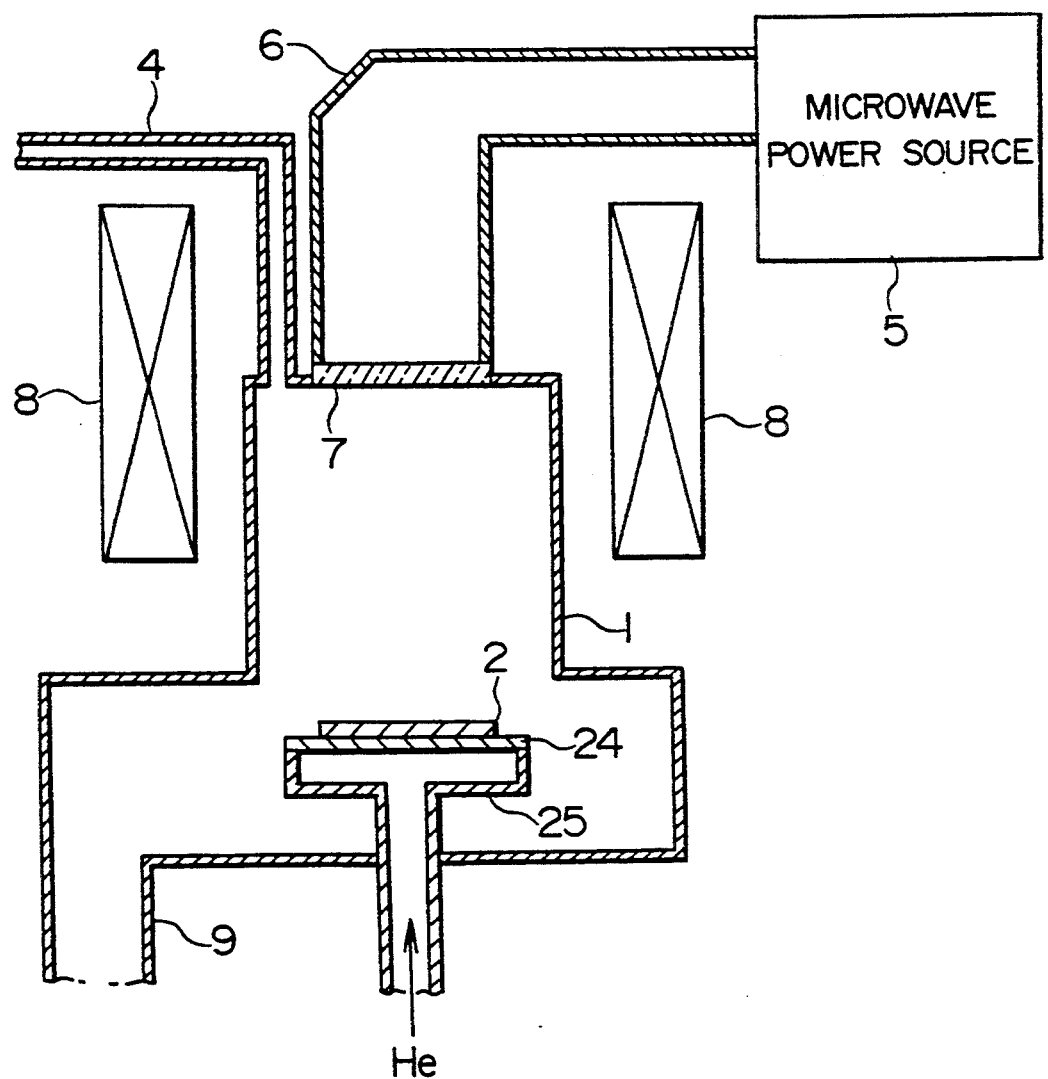
FIG. 13 is a schematic drawing showing a plasma etching apparatus in accordance with Embodiment 5 of the present invention.

FIG. 13 is a schematic drawing showing a plasma etching apparatus in accordance with Embodiment 5. The apparatus includes a superconducting stage 24 comprising a superconductor such as NbSn or the like which forms at least a surface of the stage on which the semiconductor wafer 2 is mounted. The superconducting stage 24 is kept at a very low temperature by thermal insulation means such as a vacuum double piping or the like so as to assume a superconducting state. For example, when the superconducting stage 24 is made of NbSn, He vapor is poured into to the cold insulation means 25 from a liquid He pot (not shown) so that the superconducting stage 24 can be kept in a superconducting state at a very low temperature of 18° K. or less. At this time, the superconducting stage 24 becomes a completely diamagnetic substance because of the Meissner effect which is peculiar to superconductors.

Figure 14:
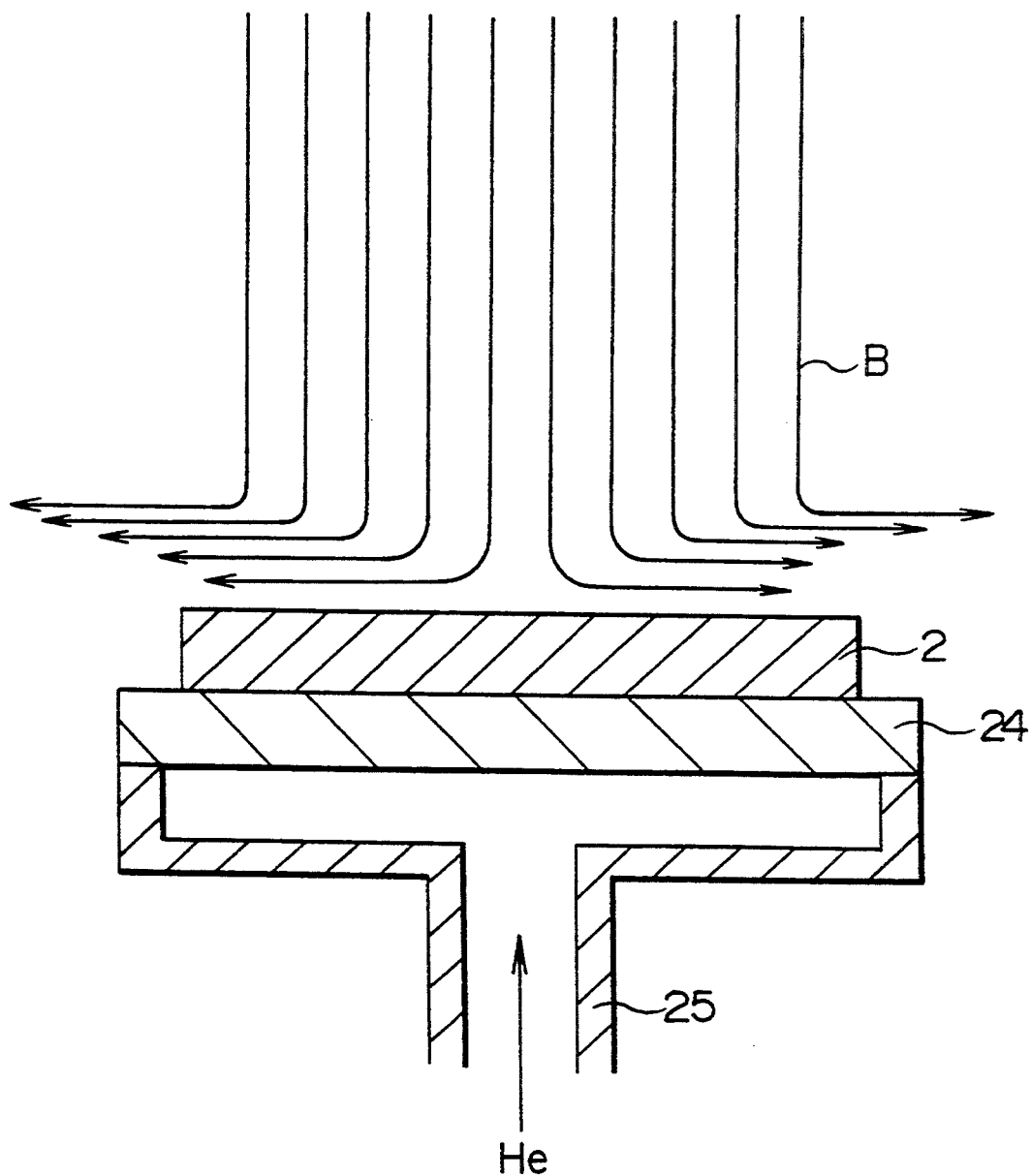
FIG. 14 is a schematic drawing showing a state wherein lines of magnetic force are sharply bent above a semiconductor wafer.

As shown in FIG. 14, the lines of magnetic force B produced by the coil 8 are extremely sharply bent near the surface of the semiconductor wafer 2. Since the electrons have a small mass and high mobility they move along the lines of magnetic force B, the number of electrons carried to the semiconductor wafer 2 is smaller than that of the conventional apparatus, as in Embodiment 4. As a result, the negative charging of the side wall of the micropattern is significantly decreased, as compared with the conventional apparatus, thereby preventing the occurrence of a notch and forming a pattern with excellent anisotropy. On the other hand, since ions have a larger mass and lower mobility than electrons, the ions cannot respond to the sharp bending of the lines of magnetic force B and are thus accelerated by the sheath electric field and vertically applied to the semiconductor wafer 2.

Embodiment 6

Figure 15:
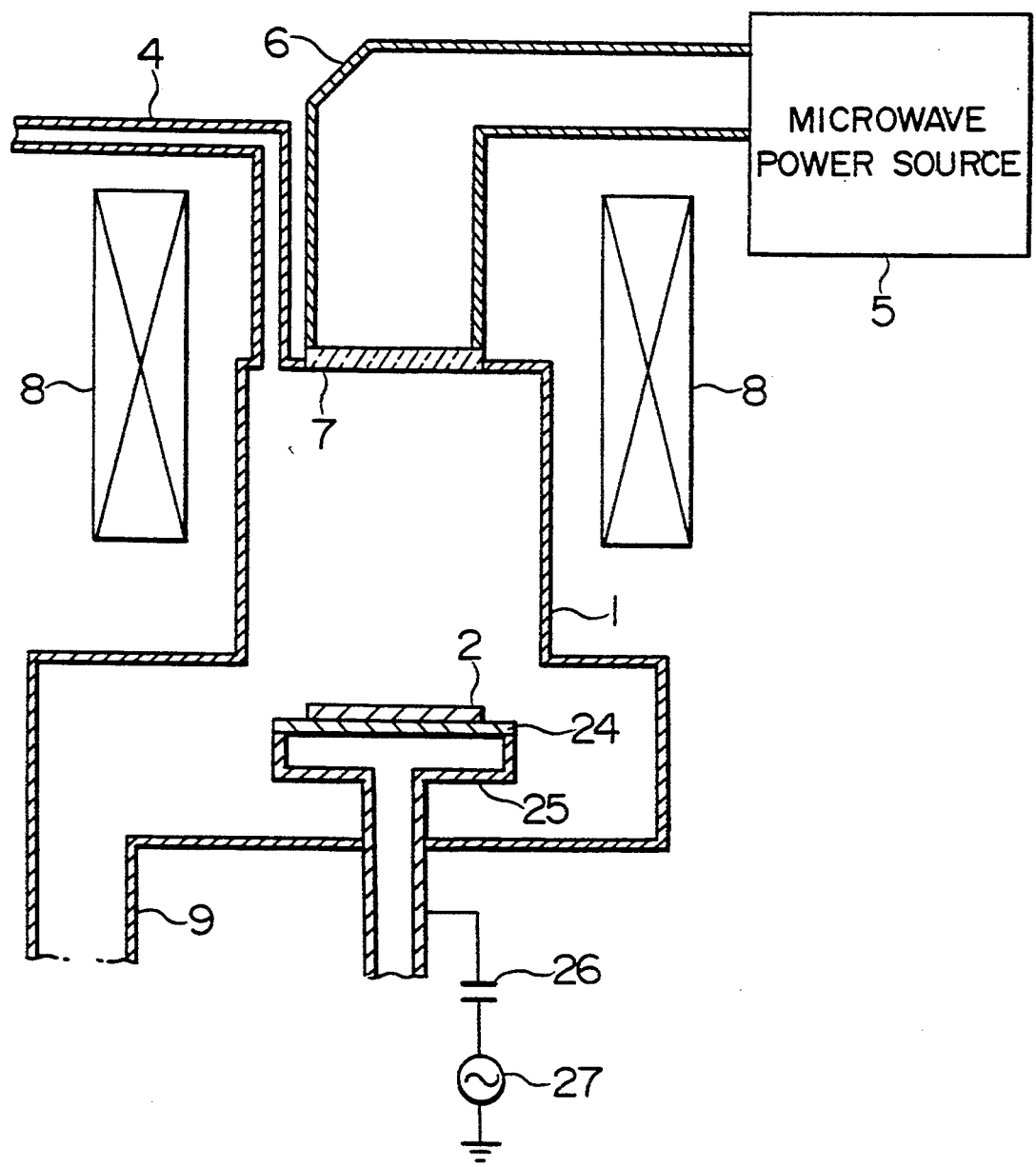
FIG. 15 is a schematic drawing showing a plasma etching apparatus in accordance with Embodiment 6 of the present invention.

FIG. 15 is a schematic drawing showing a plasma etching apparatus in accordance with Embodiment 6 of the present invention. The apparatus shown in the drawing comprises a blocking capacitor 26 and an RF power source 27, both of which are disposed on the cold insulation means 25 of the apparatus shown in FIG. 13 so that a RF bias voltage is applied to the superconducting stage 24. For example, a RF bias voltage with weak electrical power of about 300 W/m$^2$ and 13.56 MHz which does not cause etching of the base film and produces no sheath electric field is intermittently applied. When the semiconductor wafer 2 becomes negative, positive charge is thus supplied to the side wall 14 of the micropattern, whereby the negative charging is electrically neutralized. This further prevents the occurrence of a notch and permits etching with good anisotropy.

Embodiment 7

Figure 16:
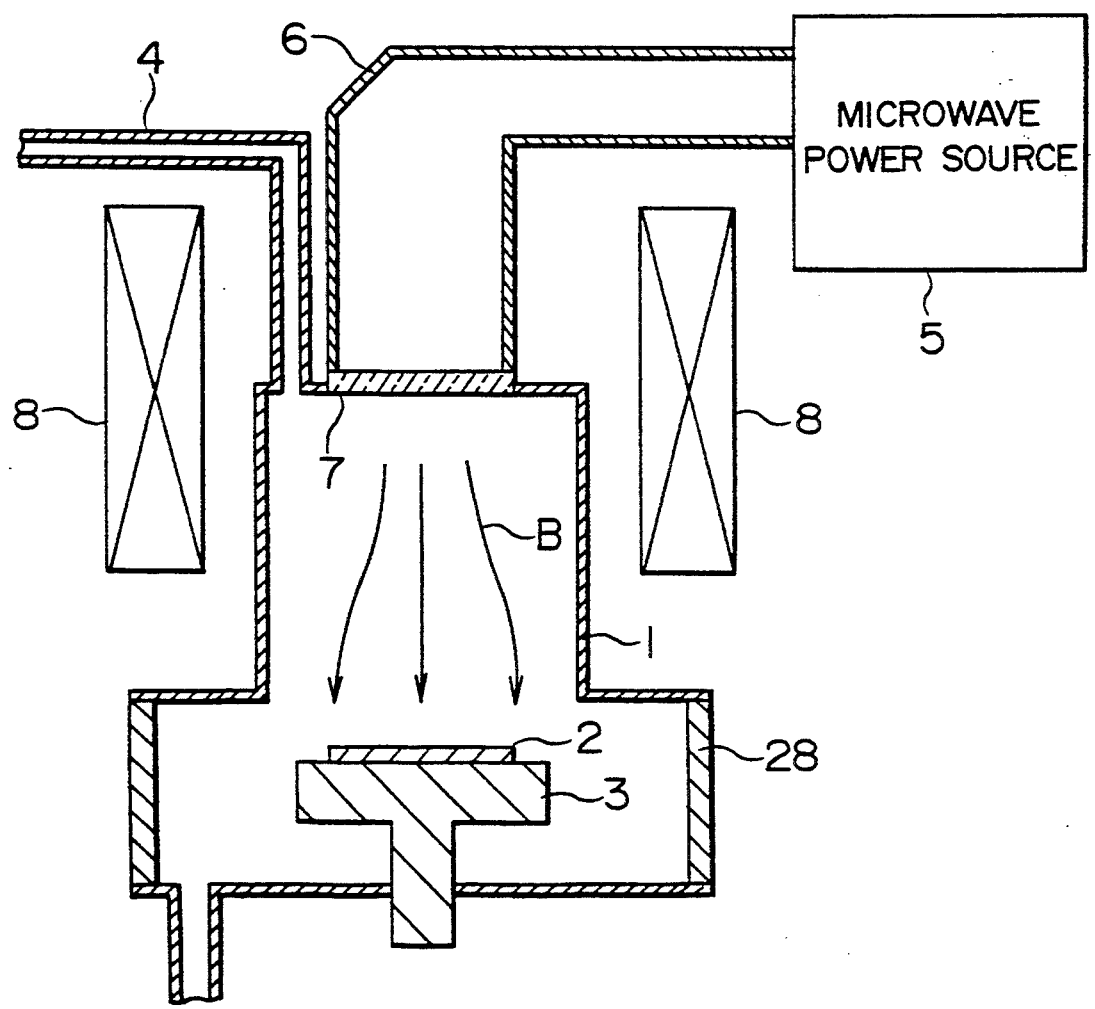
FIG. 16 is a schematic drawing showing a plasma etching apparatus in accordance with Embodiment 7 of the present invention.

FIG. 16 is a schematic drawing showing a plasma etching apparatus in accordance with Embodiment 7 of the present invention. The apparatus shown in the drawing comprises a diamagnetic member 28 which forms the wall portion of the reaction chamber 1 surrounding the stage 3. The diamagnetic member 28 contains a diamagnetic substance such as bismuth, a superconductor or the like. Although the lines of magnetic force produced by the coil 8 diverge toward the side wall of the reaction chamber 1, the lines of magnetic force B can be uniformly bent by the function (Meissner effect) of the diamagnetic member 28 to repel the lines of magnetic force and bent in a direction perpendicular to the semiconductor wafer 2. Since the direction of movement of ions is thus corrected to the perpendicular direction short of incidence on the semiconductor wafer 2, anisotropic etching can be sufficiently achieved. In addition, since the uniformity of the plasma density is improved by restricting the divergence of the lines of magnetic force, the uniformity of etching can be improved.

Figure 17:
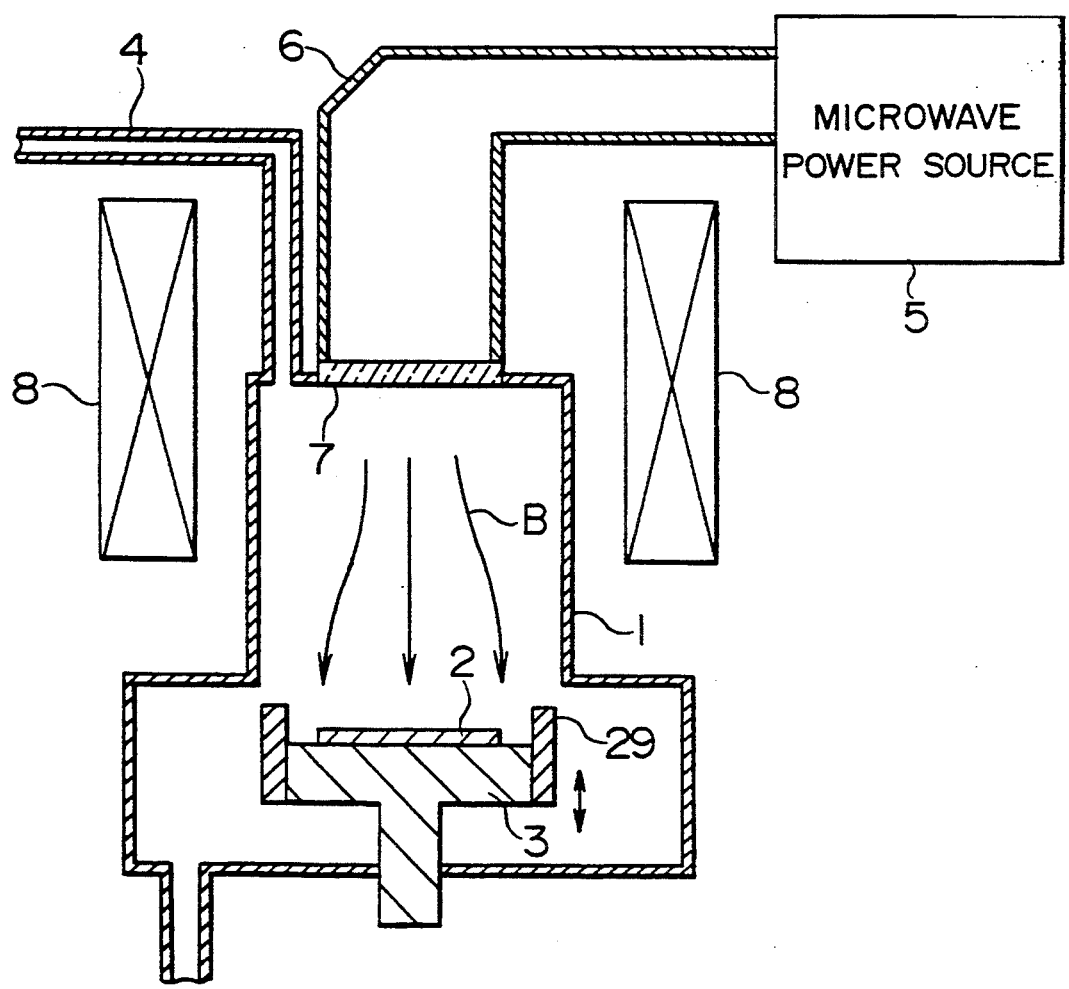
FIG. 17 is a schematic drawing showing a plasma etching apparatus in accordance with Embodiment 8 of the present invention.
Figure 18:
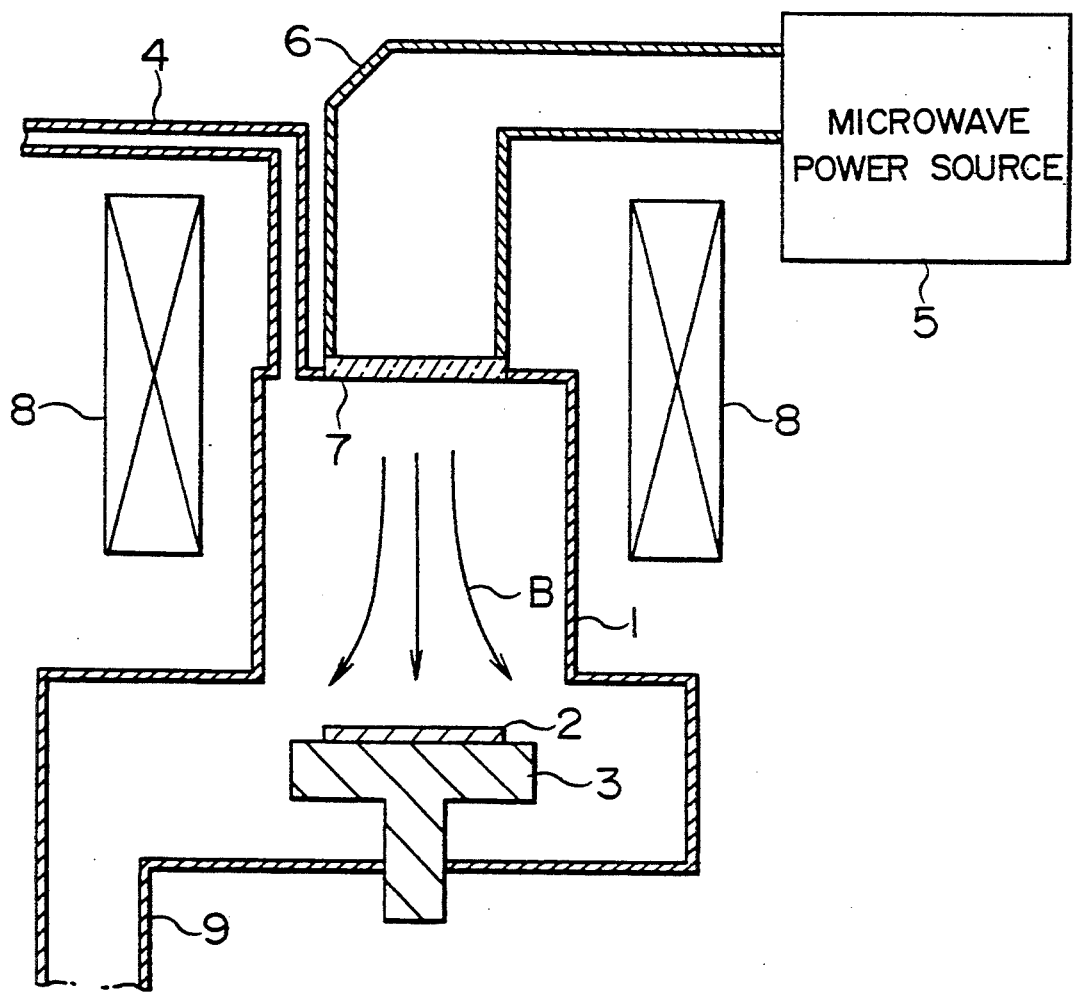
FIG. 18 is a schematic drawing showing a conventional plasma etching apparatus.

As shown in FIG. 17, a diamagnetic focus ring 29 may be surrounding the semiconductor wafer 2 on the stage 3 in place of the diamagnetic member 28 shown in FIG. 16. In this case, if the diamagnetic focus ring 29 can be vertically moved, the lines of magnetic force can be finely adjusted, and an attempt can be made to optimize anisotropic etching.

What is claimed is:

1. A method of electron cyclotron resonance plasma etching of a semiconductor wafer comprising:

generating a constant plasma in a gas in a chamber containing a semiconductor wafer by supplying microwave energy to the chamber continuously; and applying a pulsed direct current bias to the semiconductor wafer, wherein the pulsed bias has a period equal to a time constant determined by the capacitance of the semiconductor wafer and the resistance of an ion sheath at the surface of the semiconductor wafer.

2. The method of claim 1 wherein the period of the direct current pulsed bias is no more than 1 millisecond.

3. The method of claim 2 wherein the duty cycle of the direct current pulsed bias is no more than 0.999.

4. The method of claim 1 including applying a direct current pulsed bias having a voltage at least as large as an ion sheath electric field at the surface of the semiconductor wafer.

* * * * *